US005597762A

United States Patent [19]
Popovici et al.

[11] Patent Number: 5,597,762
[45] Date of Patent: Jan. 28, 1997

[54] FIELD-ENHANCED DIFFUSION USING OPTICAL ACTIVATION

[75] Inventors: Galina Popovici; Mark A. Prelas; T. Sung; S. Khasawinah, all of Columbia, Mo.

[73] Assignee: Nonophase Diamond Technologies, Inc., Vancouver, Canada

[21] Appl. No.: 313,641

[22] Filed: Sep. 27, 1994

[51] Int. Cl.⁶ .................................................. H01L 21/225
[52] U.S. Cl. ........................ 437/169; 437/160; 437/171; 437/173
[58] Field of Search ........................ 437/160, 169, 437/168, 171, 173, 954, 162; 257/77; 168/DIG. 93, 99, 35

[56] References Cited

U.S. PATENT DOCUMENTS

| | | | |
|---|---|---|---|
| 4,398,343 | 8/1983 | Yamazaki | 136/258 |
| 5,002,899 | 3/1991 | Geis et al. | 437/173 |
| 5,055,424 | 10/1991 | Zeidler et al. | 437/188 |
| 5,075,757 | 12/1991 | Ishii | 357/67 |
| 5,086,014 | 7/1992 | Miyata et al. | 437/103 |
| 5,210,431 | 5/1993 | Kimoto et al. | 257/72 |
| 5,243,199 | 9/1993 | Shiomi et al. | 257/77 |
| 5,382,808 | 1/1995 | Dreifus et al. | 257/77 |
| 5,382,809 | 1/1995 | Nishibayashi et al. | 257/77 |

FOREIGN PATENT DOCUMENTS

| | | |
|---|---|---|
| 4331937 | 3/1994 | Germany . |
| 5117089 | 5/1993 | Japan . |

OTHER PUBLICATIONS

G. Popovici et al., "Diffusion of Impurities Under Bias in CVD Diamond Films," Carter et al. (eds.), Diamond, SiC and Nitride Wide Bandgap Semiconductors, *Materials Research Society Symposium Proceedings* 339:601–606, Apr. 1994.

*Primary Examiner*—Tom Thomas
*Assistant Examiner*—S. Mulduri
*Attorney, Agent, or Firm*—Chernoff, Vilhauer, McClung & Stenzel

[57] ABSTRACT

A method of making a semiconductor material using a modified forced diffusion method includes the steps of placing the semiconductor material on a substrate in a vacuum vessel, locating an impurity atop the semiconductor material, creating a high voltage potential across the semiconductor material, heating the semiconductor material and bombarding the semiconductor material with photons under the effects of the high voltage and heat previously created. The process is particularly applicable to creating N-type diamond semiconductor material.

19 Claims, 2 Drawing Sheets

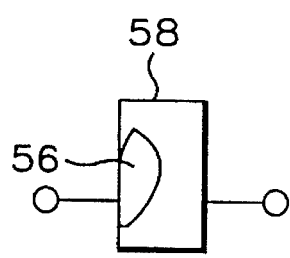
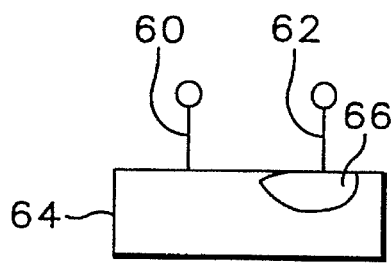
FIG.6A  FIG.6B
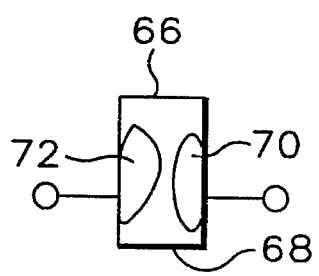
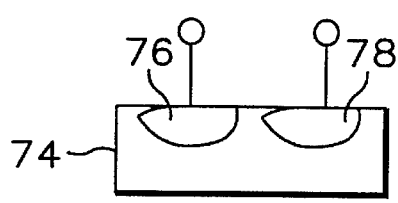
FIG.7A  FIG.7B
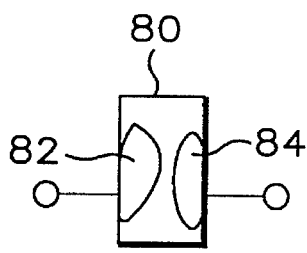
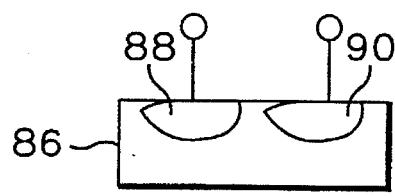
FIG.8A  FIG.8B
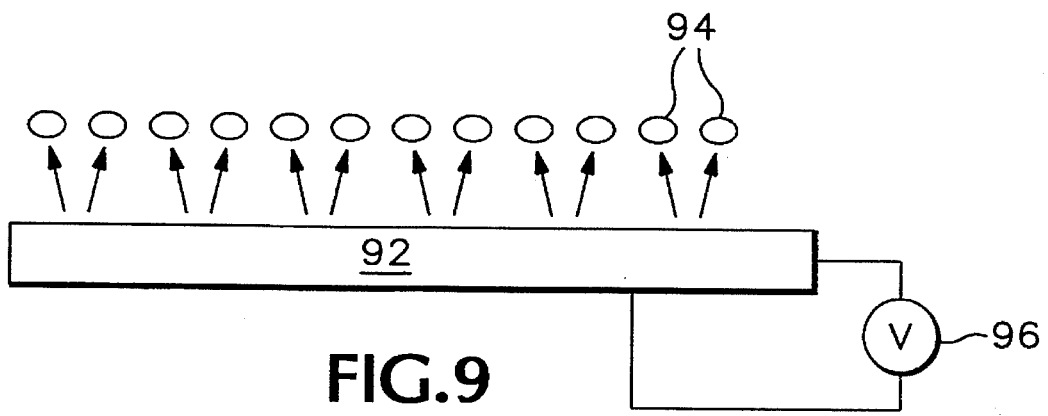
FIG.9

FIELD-ENHANCED DIFFUSION USING OPTICAL ACTIVATION

BACKGROUND OF THE INVENTION

The following invention relates to a forced diffusion process for making semiconductor material and in particular relates to a process for doping diamond material with impurities to make N-type diamond semiconductors which may then be used in electronics (e.g., high voltage switches, integrated circuits) optics, and other applications.

All semiconductors such as silicon, which are capable of being doped with impurities to create IC chips of various circuit configurations, are subject to limitations in high temperature, chemically corrosive, and high radiation environments. Diamond is one of the best insulators known, but heretofore it has been very difficult to produce diamond semiconductor material. Some success has been attained at creating P-type diamond semiconductors, but the production of N-type diamond has been largely unsuccessful. P-type diamond material has been made using in situ doping and ion implantation. N-type diamond has not been made by any process except for the process of the invention to be described herein. Furthermore, in situ doping and ion implantation introduce undesirable lattice defects in the diamond when P-type impurities are used.

Forced diffusion is a method of doping semiconductor material with impurities that has been used in the past with semiconductor material such as silicon. In a forced diffusion process, semiconductor material with impurity material placed on it is first heated Dopant material in the lattice is then activated by the heat (i.e., it becomes ionized). An electric field created by a high voltage placed across the silicon material drives the charged dopant atoms into the semiconductor lattice structure.

Heating alone may be sufficient to ionize only shallow level impurity dopants, but the major problem with forced diffusion is to diffuse enough impurity atoms in the lattice structure to contribute to conduction. The number of atoms is a function of temperature and activation energy according to the Boltzmann distribution. The higher the temperature, the more that impurity ions are created which will diffuse into the lattice structure. The problem is that with diamond the lattice structure begins to break down into amorphous carbon or graphite when temperature levels high enough to cause ionization are reached due to metastability of the diamond phase.

Forced diffusion has been achieved for impurity in diamond exhibiting P-type conduction and examples are noted in a paper entitled "Diffusion of Impurities Under Bias in CVD Diamond Films," Popovici et al *Materials Research Society*, Apr. 1994. This paper notes that diamond doping is difficult because of lattice rigidity and the small covalent radius of carbon. This means that only boron and nitrogen are potentially available since only these dopants have covalent radii small enough to enter the diamond lattice.

Diamond semiconductors of N-type material require high enough concentrations of dopant atoms with shallow energy levels in order to provide the requisite degree of conductivity. Thus far, diffusion doping processes have not been capable of achieving this result. Ion implantation and in situ doping have the problems associated with them that are noted above. What is needed, therefore, is a doping process for diamond material that can create N-type semiconductor material.

SUMMARY OF THE INVENTION

The present invention is a process for making N-type semiconductor material and in particular diamond semiconductors using a modified forced diffusion process. The process includes the steps of placing the diamond material on a substrate in a vacuum vessel, placing an impurity on the diamond material, creating a high voltage potential across the diamond material, heating the diamond material and bombarding the diamond material with photons from a photon source under the effect of heat and an electric field.

In order to create an N-type semiconductor a lithium salt such as $LiClO_3$ may be deposited atop the diamond material. Lithium is a good dopant to produce N-type material because theory predicts a shallow energy level of around 0.1 eV. Photon bombardment of the diamond material is provided by a laser. A laser with a photon energy Ep activates the impurity atoms with the required activation energy Ea where Ep is greater than Ea. This enables the donor atoms to diffuse along the field lines to interstitial positions in the diamond lattice. As the lithium atoms diffuse into the diamond material under the influence of the electric field created by the voltage across the diamond, they are bombarded by photons from the laser which provides the necessary activation energy, $E_a$ as that term is defined in Boltzman's equation. The number of impurity atoms which contribute to conduction is given by the Boltzman equation which is: $N=N_0 \, e^{-Ea/kT}$ where N is the density of impurity atoms which carry current, $N_0$ is the density of impurity atoms, $E_a$ is the activation energy, k is Boltzman's constant and T is the temperature of the semiconductor. From the above equation it can be seen that a shallow level N-type dopant material provides better conductivity at any given temperature.

This process may also be used for P-type impurities by changing the electric field direction because donor impurity ions are positive (N-type) and acceptor impurity ions are negative (P-type).

According to the process of the invention the high temperature ionizes some shallow level dopants while the force created by the electric field drives the charged dopant into the target semiconductor material creating a gradient near the diamond's surface. The laser is directed at the migrating lithium atoms as a photon source to provide the activation energy $E_a$. This is a far more effective method of providing activation energy than previous methods which used only heat because of the limitations inherent in heating some semiconductor target materials, particularly diamond. Also the laser optically ionizes far more impurity atoms than could previously be produced by heat alone.

Additionally, the laser, because it acts locally in the target material, may be used to create zones where high concentrations of donor atoms may abound. In this way, the laser can be focused upon a certain area or can be moved to create linear strips defining doped regions. This process can be used to create high voltage switches, diodes and PNP and NPN transistors, P-N junctions, PIN structures, NIP structures, NIN structures, PIP structures or any other structure which uses N-type material. In high voltage switches, impurities may be diffused, either on the front and back of a thin diamond plate or in a side-by-side configuration. When the laser is used to create doping zones, it functions as a point heat source to "draw" a pattern on the impurity layer resting on the diamond while a voltage is placed across the diamond material and a second laser is used to optically ionize impurities which enter the diamond lattice.

Another application of the forced diffusion process of the invention is the creation of a flat screen display. A sheet of N-type diamond material emits electrons when charged with a voltage. This property makes it practical to place luminescent phosphor material over the diamond layer which will emit light when bombarded by electrons. Various addressing techniques can be used to create local voltage gradients to, in effect, create pixels in the phosphor layer.

Yet another application of the instant invention is the coloring of natural diamond. According to this method the diamond is placed on a substrate holder and an impurity placed on the diamond. The substrate is heated and the laser illuminates the diamond to ionize the impurity. As with the previous processes a high voltage is placed across the diamond, and over a period of time impurities are diffused into the diamond. If a higher activation energy is required for the particular impurity, the energy of the laser must be such that $Ep > Ea$. The process will work both for impurities located at interstitial sites as well as for those substituted for carbon in the diamond lattice. For this purpose an excimer laser may be used which provides sufficient energy to break carbon's sp3 bonds and create vacancies. In this instance impurities will diffuse into vacancies and become substitutional. As an example, diffusing boron into diamond using this process creates a blue colored diamond.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 6A is an illustration of a first embodiment of a diode created according to the method of the invention.

FIG. 6B is an illustration of a second embodiment of a diode created according to the method of the invention.

FIGS. 7A and 7B are first and second embodiments, respectively, of NPN transistors created according to the method of the invention.

FIGS. 8A and 8B are first and second embodiments, respectively, of PNP transistors created according to the method of the invention.

FIG. 9 is a schematic illustration of a flat screen display panel utilizing N-type diamond material created in accordance with the invention.

DETAILED DESCRIPTION OF THE PREFERRED EMBODIMENT

Figure 1:
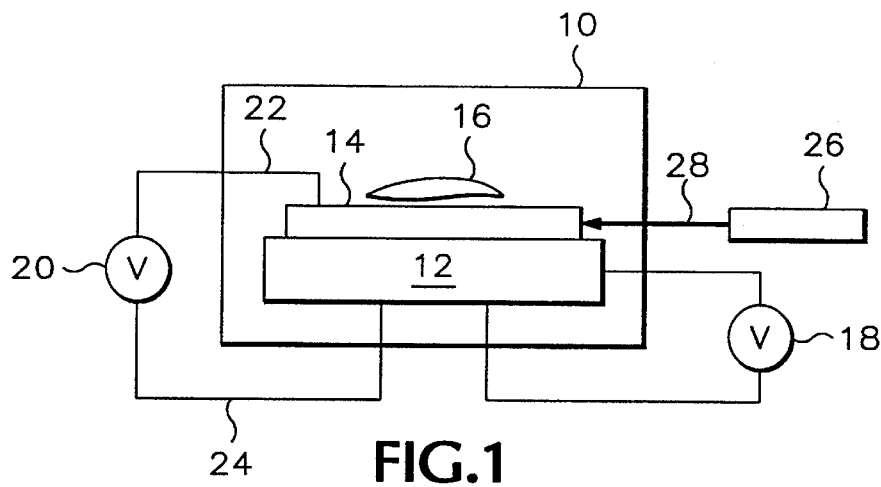
FIG. 1 is a schematic view of a modified forced diffusion process for making N-type or P-type diamond semiconductor material.

The basic forced diffusion process of the invention is illustrated in FIG. 1. A vacuum vessel 10 contains a substrate holder 12. A target chip or substrate film made from diamond 14 is deposited on the substrate holder 12. An impurity 16 such as a lithium salt is placed on top of the diamond 14. Coupled to the substrate holder 12 is a heating unit 18. A source of high voltage 20 has an input 22 coupled to the diamond material 14 and an output coupled to the substrate holder 12. The voltage unit 20 creates a voltage potential and consequently an electric field across the diamond material 14. A laser 26 directs a photon beam 28 at the diamond material.

In actual operation the vacuum vessel 10 is evacuated and the heating unit is turned on. The heater 18 may be made of graphite and ceramic heating elements and its purpose is to heat the diamond material 14 to temperatures of between room temperature and 1400° C. As the heating unit 18 reaches the desired temperature, the high voltage source 20 is turned on, establishing an electric field across the diamond material 14. The voltage is highly variable, but experimentally, voltages of around 500 volts have produced good results. An acceptable laser for the process is a helium-neon laser operating at 632.8 nm which, in this configuration, provides Ep greater than Ea.

Figures 2A, 2B:
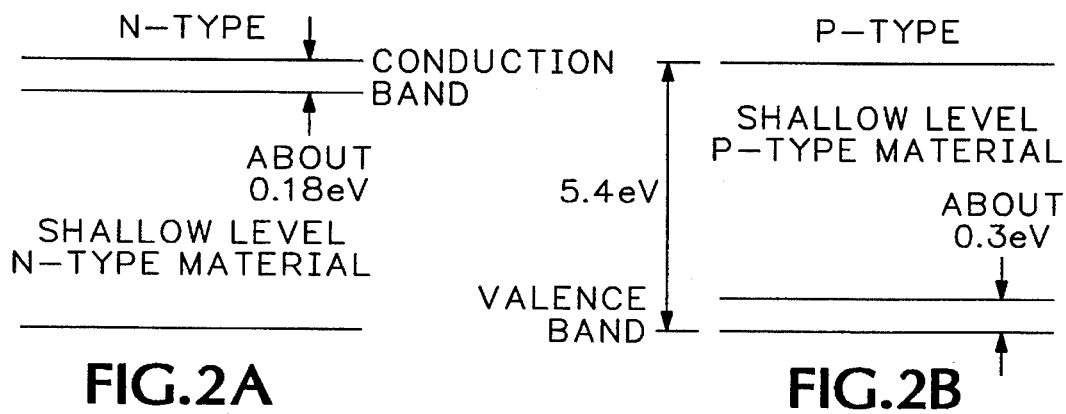
FIG. 2A is a schematic diagram illustrating energy levels in diamond material for an N-type dopant.
FIG. 2B is a schematic diagram illustrating energy levels in diamond material for a P-type dopant.

As the diamond material 14 and the lithium salt ($LiClO_3$) become heated, lithium, oxygen and chlorine atoms in the impurity material 16 begin to activate (e.g., ionize in the lattice). Under the effect of the electric field created by the voltage source 20, these atoms begin to migrate into the crystalline lattice of the diamond material 14. As this occurs, nonionized lithium atoms also migrate into the top of the diamond film where they are bombarded by photons 28 from the laser 26. The photon bombardment provides activation energy for these atoms which in turn creates an even steeper gradient, drawing more lithium atoms into the diamond lattice structure. Thus, there is a cascading effect which results in a large number of lithium ions being located interstitially inside the diamond lattice structure. In the diffusion process both interstitial and substitutional atoms will be diffused with little degradation of the diamond crystalline structure. As shown in FIG. 2A the energy difference between diamond's valence band and its conduction band is 5.4 eV. The activation energy of the donor impurities (N-type) have been shown experimentally to be 0.09 eV. This may be due to the lithium atoms or oxygen or chlorine atoms, or some combination of all three. The shallow level is most desirable in this case because it provides for good conduction of current at room temperature.

As FIG. 2B shows, when P-type semiconductor material is desired, boron may be used as an acceptable impurity. The activation energy of the boron acceptor impurity is 0.3 eV and it displays a work function of 5.2 eV. The process is in all other respects, the same.

Figure 3:
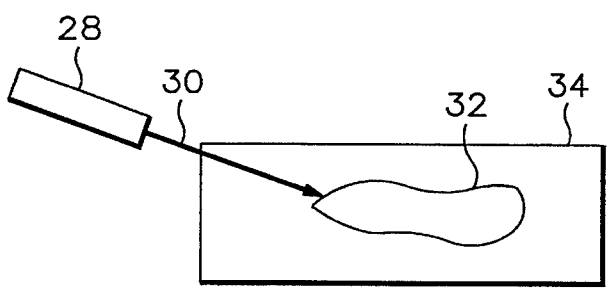
FIG. 3 is an illustration of a diamond substrate with an impurity placed upon it wherein a laser is used to create impurity areas.
Figure 4:
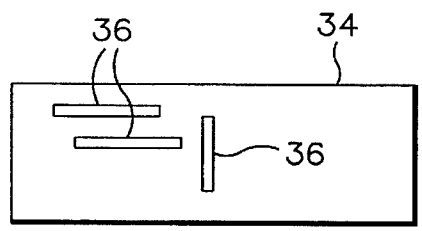
FIG. 4 is an illustration of a diamond chip which has been treated according to the process of FIG. 3.

A variation of the process of FIG. 1 is shown in FIG. 3. In this case the heating unit 18 is not used and a second laser 28 directs a collimated light beam 30 towards impurity material 32 deposited on a diamond substrate 34 in the vacuum vessel 10 as shown in FIG. 1. With the voltage on and the first laser 26 directed at the diamond substrate 34, the second laser 28 is moved across the impurity 32 where it functions as a point source of heat. As it heats the impurity material 32 in lines or strips, forced diffusion takes place under the influence of the electric field caused by the high voltage unit 20 and the optical ionization of migrating impurity atoms by the laser 26. The result is shown in FIG. 4 in which patterned strips 36 of impurity material are "drawn" on the diamond substrate 34.

Figure 5A:
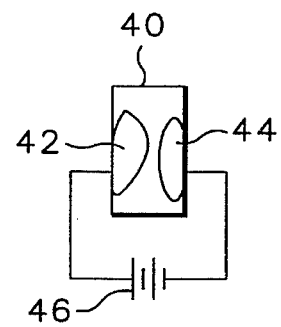
FIG. 5A is an illustration of a first embodiment of a high voltage switch created according to the invention.
Figure 5B:
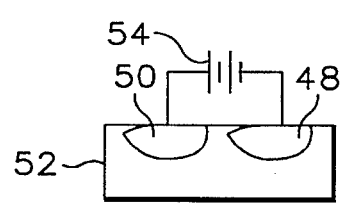
FIG. 5B is an illustration of a second embodiment of a high voltage switch created according to the invention.

Given the process of the invention, a number of applications are possible. For example, FIGS. 5A and 5B show high power transistors. FIG. 5A shows a thin diamond plate 40 which includes regions on both the front and back 42 and 44, respectively, of N-type dopant which has diffused into the diamond material. If a voltage source 46 is placed across the diamond plate 40, the device will act as a switch. In FIG. 5B the N-type diamond materials 48 and 50 have been placed side-by-side in a thin plate of diamond material 52. A voltage source 54 will cause conduction between the two regions 50 and 48 depending upon the magnitude of the voltage and the lateral distance between the two regions.

Another application is shown in FIGS. 6A and 6B, In FIG. 6A P-type dopant has diffused into a plate previously doped with N-type material, According to this embodiment a very thin diamond plate is used and the device will act as a diode, Essentially, this same structure is shown in FIG. 6B but in this case electrodes 60 and 62 are located on the same side of a P-type diamond plate 64, N-type material 66 is created in a region on the surface of the P-type diamond 64.

Referring to FIGS. 7A and 7B constructions similar to those described for high voltage switches (FIGS. 5A and 5B) and diodes (FIGS. 6A and 6B) are shown for NPN type transistors. The first type of NPN transistor 66 shows a plate of P-type diamond material 68 doped with N-type material 70 and 72 respectively on either side thereof, In FIG. 7B the P-type diamond chip 74 includes side-by-side areas 76 and 78 respectively of N-type diamond material.

FIGS. 8A and 8B illustrate the same type of construction for PNP transistors, In this case an N-type diamond plate 80 includes P-type diamond material 82 and 84 positioned on opposite sides of the plate. The plate must be very thin in order to provide conduction between the P-type diamond material regions 82 and 84. In FIG. 8B a flat diamond chip 86 includes side-by-side regions 88 and 90 respectively of P-type diamond material.

FIG. 9 illustrates the use of an N-type diamond plate 92 as an electron emitter to create a display screen, The material 92 emits electrons represented by the arrows which impact phosphor centers 94 resident in a thin film of phosphor material (not shown). When a voltage source 96 is impressed across the N-type diamond material, electrons are emitted which impact the phosphor centers 94 causing light emission.

Although the invention has been shown using diamond film as a semiconductor substrate to be doped with an impurity, the method will work for any semiconductor material such as silicon. In addition, although the invention has been described using lithium compounds as N-type donor material, oxygen, fluorine and chorine can also be used as dopants. Additionally, although the invention has been described in terms of the use of a laser as a means of providing optical ionization, any method of photon bombardment is acceptable. Good results were obtained using a helium-neon laser at 632.8 nanometers. Other wave lengths, however, may be acceptable. In general, for maximum efficiency the wave length and the type of photon bombardment utilized should be configured to match the activation energy of the impurity.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of making semiconductor material comprising the steps of:

(a) placing a diamond substrate material on a substrate holder in an inert atmosphere or a vacuum vessel;

(b) placing an impurity on the diamond substrate material;

(c) creating a voltage potential across the diamond substrate material;

(d) heating at least a portion of the diamond substrate material; and (e) bombarding the diamond substrate material with photons during the execution of steps (c) and (d).

2. The method of claim 1 wherein the photon source is a laser.

3. The method of claim 2 wherein the impurity used in step (b) is of the type that creates N-type semiconductor material.

4. The method of claim 3 wherein the impurity is taken from the group lithium, oxygen, fluorine and chlorine.

5. The method of claim 2 wherein the impurity is of the type that creates P-type semiconductor material.

6. The method of claim 4 wherein the impurity is a lithium salt.

7. The method of claim 1 wherein step (d) is accomplished by heating the substrate holder.

8. The method of claim 1 wherein step (e) is accomplished by focusing a laser beam onto the impurity and moving the beam to create a desired pattern on the diamond substrate material.

9. The method of claim 3 wherein the laser is a helium-neon laser.

10. A method of making semiconductor material comprising the steps of:

(a) placing a diamond substrate material on a substrate holder in an inert atmosphere or a vacuum vessel;

(b) placing an impurity on the diamond substrate material;

(c) creating an electric field across the diamond substrate material;

(d) heating at least a portion of the diamond substrate material; and (e) bombarding the diamond substrate material with photons during the execution of steps (c) and (d) whereby to cause atoms from the impurity to diffuse into the diamond substrate material.

11. The method of claim 10 wherein step (e) is performed by a laser.

12. The method of claim 11 wherein the impurity used in step (b) is of the type that creates N-type semiconductor material.

13. The method of claim 12 wherein the impurity is taken from the group lithium, oxygen, fluorine and chlorine.

14. The method of claim 11 wherein the impurity is of the type that creates P-type semiconductor material.

15. The method of claim 13 wherein the impurity is a lithium salt.

16. The method of claim 10 wherein step (d) is accomplished by heating the substrate holder.

17. The method of claim 10 wherein step (e) is accomplished by focusing a laser beam onto the substrate material near the impurity and moving the beam to create a desired pattern on the diamond substrate material.

18. The method of claim 12 wherein the laser is a helium-neon laser.

19. The method of claim 10 wherein a photon source is provided to perform step (e) such that the photons have an energy Ep which is greater than an activation energy Ea of the impurity.

* * * * *